Jan. 21, 1969 F. C. COLLINS 3,423,527
SOLID STATE SCANNING DEVICE
Filed March 4, 1965

INVENTOR
FRANK C. COLLINS
BY
Lovette & Miskin
ATTORNEYS 3,423,527

SOLID STATE SCANNING DEVICE

Frank C. Collins, Brooklyn, N.Y., assignor to PRD Electronics, Inc., Brooklyn, N.Y., a corporation of New York Filed Mar. 4, 1965, Ser. No. 437,096
U.S. Cl. 178—7.1 5 Claims
Int. Cl. H01j 39/12; H04n 3/10

The instant invention relates to semiconductor devices for detecting electromagnetic radiation and, in particular, the invention provides a system for two-dimensional detection and scanning of a radiation source.

This invention presents new and improved means of image pickup as originally presented in U.S. Patent 3,111,556 entitled "Image Pickup Devices and Scanning Circuits Therefor" by Joseph Knoll et al. The device described in said patent is based upon a particular semiconductor property, i.e., a beam of radiation may produce minority carriers in a doped semiconductor. This packet of minority carriers is released from the radiation input point. When a voltage gradient is impressed on the semiconductor material, the minority carriers will drift to the end of the semiconductor material. A reversed biased collector junction is provided at the end of the semiconductor material. The minority carriers appear at the collector junction as a pulse of current which is a function or image of the input radiation. In accordance with this property, the prior art patent contemplates an image pickup device. A semiconductor strip is exposed to an electromagnetic radiation source. The radiation pattern is transformed into a varying voltage level by switching on a preselected and suitably timed potential gradient which will sweep the produced minority carriers to the collector junction for ultimate detection.

The above concept is suitable for one-dimensional pickup devices. In such systems, a single semiconductor strip serves as the sensitive detector. For two-dimensional image detection, the same concept can also be applied. Two methods of pickup and scanning are presented in said patent. One arrangement joins a plurality of one-dimensional strip detection. The single strips are insulated from each other by a thin non-conducting cement joint. An input and output switching matrix is arranged so the voltage gradient is applied to each strip sequentially, whereby the output image is detected line by line. A second arrangement uses a two-dimensional semiconductor with a plurality of spaced collector electrodes at one end. Two sets of pulses are applied. First, a vertical pulse is sent through the rectangular semiconductor element to space a line of carriers under the collector electrodes. The horizontal pulse is then applied to send the minority carriers to the collector. This procedure is continued for examining the output serially line after line.

In applying the semiconductor property of minority excitation to two-dimensional uses, the aforementioned patent cannot obtain a very fine image reproduction. Either one of the methods as above indicated cannot reproduce radiation sources to satisfactory detail because of physical limitations of actual construction. The invention as will be described, applies diffusion techniques to the semiconductor materials to produce an image reproduction of at least ten times better detail than provided heretofore.

A second limitation in the prior art is in the noise of the system. As previously contemplated, collector junctions are used to detect the current pulses formed by the packet of minority carriers. As is well known in the art, the use of a p-n junction results in a noise problem. The instant invention provides a method of detection of the minority carriers without the use of a p-n junction.

Accordingly, one object of the instant invention is to provide a two-dimensional image pickup device which will detect electromagnetic radiation to a finer detail than has been previously known in the art.

A second object is to provide an image pickup unit which will reduce the noise problem of detection and scanning of electromagnetic radiation.

Further objects and advantages will become apparent from the following description of the invention taken in conjunction with the figure, in which.

Figure 2:
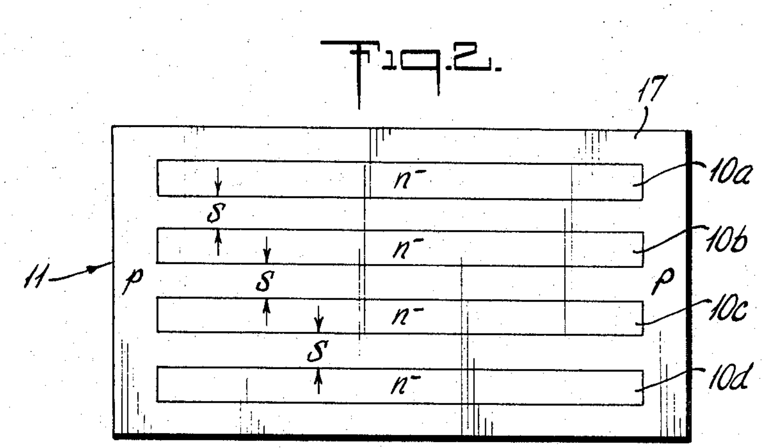
FIG. 2 is a top view of the semiconductor surface used in accordance with the invention.

In the field of semiconductor application, the art of diffusing different materials together is well known. A particular method is the epitaxial diffusion technique to form a wafer of semiconductor material. For illustrative purposes, p-type silicon will be used. Silicon is satisfactory for sensing radiation below its optical cut-off of 1 micron wavelength. For longer radiation wavelengths, other semiconducting materials with a lower energy bandgap may be used. This material is exposed to $H_2$ and $SiHCl_3$ at 1200° C. A reaction is formed whereby a thin layer of lightly doped silicon of n-type conductivity is deposited on the entire surface of the wafer. The surface of the silicon is then oxidized by processes well known in technology. Then the strip areas 10*a, b, c, d,* etc., FIG. 2, are protected by a photographically fixed mask. The exposed oxide areas are removed by chemical etching by employing, for example, hydrogen fluoride. The oxide remaining on the wafer surface serves as a mask to prevent in the subsequent diffusion operation, uptake of the doping substance in these areas. The diffusion technique conventionally involves the exposure of the surface of the semiconductor to vapor of desired doping impurities at elevated temperatures. The p-type dopant is diffused right through the epitaxial layer of the unmasked silicon surface. The process leaves a plurality of side-by-side thin strips, depicted in FIG. 2 as 10*a, b, c, d,* etc., of high resistivity n-type material embedded in low resistivity p-type material. By using the diffusion technique, it is possible to diffuse n-layer strips at intervals of 1/1000 inch apart. The minute and accurate spacings of 1/1000 inch distances between strips 10*a, b, c, d,* etc., is depicted by reference S in FIG. 2. The active surface area of such a device is schematically shown in FIG. 2.

The invention contemplates using the above described diffusion technique to provide a two-dimensional semiconductor surface 17 for use as an image pickup device as depicted in the figures.

Figure 1:
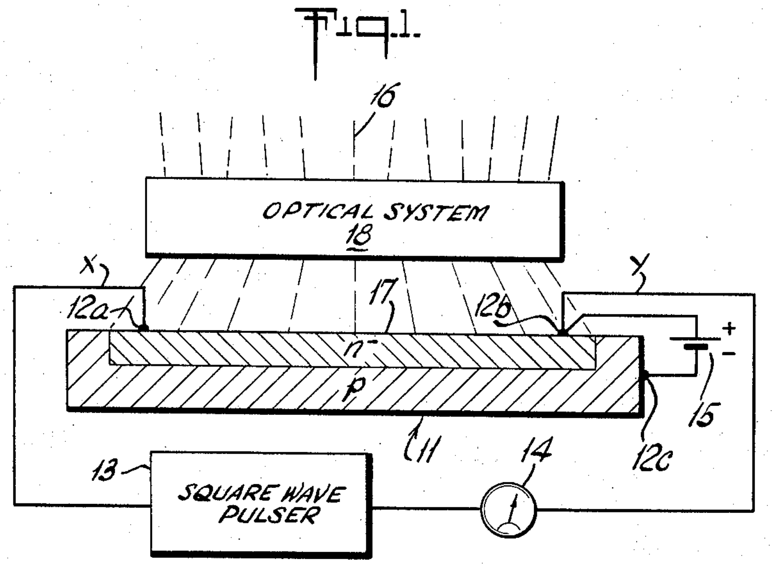
FIG. 1 is a schematic diagram depicting the invention as described herein.

With reference to FIG. 1, an epitaxially diffused semiconductor 11 has the n-type strips 10*a, b, c, d,* etc. embedded in the p-type material. Points 12*a*, 12*b* at the opposite ends of each n-strip are simple ohmic contacts attached directly to the semiconductor material by means of standard methods. A square wave pulse 13 is connected to the n-type material through ohmic contacts 12*a* and 12*b*. Square wave pulser 13 may consist of any one of a group of devices necessary to produce the desired pulse. This group may be typically a variable frequency oscillator, a pulse shaper, a one-shot multivibrator and pulse amplifier and any necessary concomitant switching matrix, whereby the leads X, Y are sequentially connected one at a time to the opposite ends of the respective side-by-side n-strips. Any known sequentially switching matrix technique may be used, whereby a desired voltage gradient is serially connected across the ends of the individual n-strips, one strip at a time. An ammeter 14 is in series with pulser 13 for sensing the output current. A DC voltage source 15 provides a reverse bias arrangement between the p-n materials, in other words, each n-strip is biased with respect to the p material. Note, that the bias source 15 is also connected to the semiconductor materials by means of ohmic contacts such as 12*b* and 12*c*.

A radiation source 16 under test is exposed to the two-dimensional semiconductor surface 17. An optical system depicted by reference 18 is employed for focusing the radiation from source 16 to the active detecting surface 17 of semiconductor device 11. The electromagnetic radiation produces packets of minority carriers in semiconductor surface 17. Pulser system 13 applies pulses serially, that is to say, sequentially to the successive strips 10*a*, *b*, *c*, *d*, etc. of n-type material by reason of concomitant matrix switching incorporated therewith. The applied voltage gradient provided by pulser 13 produces the packets of minority carriers to flow down to the opposite strip end to produce a pattern of readings on meter 14 in accordance with the radiation pattern sensed by semiconductor device 11. A scanning device may be used in place of meter 14 to scan visually the radiation image or to record permanently its pattern. Since the spacing S of the epitaxial material is extremely close, an almost exact image of the radiation source is obtained from the n-type strips.

In the instant invention, it is seen that no p-n junction is used to collect the minority carriers. The output is taken directly from the n-type material strips without a collector junction. The p-type material is merely used as a separation device for the n-type material strips. This procedure eliminates the noise problems produced by p-n junctions. The n-type and p-type regions may be reversed in the above application depending on the conditions of the particular case.

It is intended that all matter contained in the above description or shown in the accompanying drawings shall be interpreted as illustrative and not in a limiting sense.

What is claimed is:

1. Electromagnetic radiation detection means comprising:
   - a semiconductor device having a two-dimensional active area of diffused material of opposite types of conductivities,
   - means for focusing an image of the radiation on said active area,
   - pulsing means for providing a voltage gradient to one type of said diffused material,
   - said pulsing means being coupled to opposite terminals both of which are located on said one diffused material, and detector means connected to said one type of material for detecting electrical signals received therefrom.

2. A device as defined in claim 1 further including, voltage supply means for providing a bias arrangement between said two types of conductivities, and ohmic contact means for connecting said voltage gradient means to spaced apart points along said one type of conductivity.

3. In a radiation detection system, the method of using diffused semiconductor means for forming an active area of opposite types of conductivity materials to respond to an electromagnetic radiation source, focusing an image of said source on the surface of said active area, applying a preselected voltage gradient by means of ohmic contact to selected points along one of said materials, and sensing the carrier flow through said one material only.

4. In an electromagnetic radiation detection system comprising:
   - a plurality of spaced semiconductor material of selected conductivity for image pickup,
   - an opposite type of semiconductor material for insulating said spaced semiconductors of said first material,
   - means for focusing an image of the radiation onto said spaced image pickup material,
   - means for providing a preselected voltage gradient to said spaced semiconductor materials, and means for sensing the carrier flow through said spaced semiconductor material apart from said opposite type of semiconductor material for providing an image of a radiation pattern sensed by the detection system.

5. In an electromagnetic radiation detection system comprising, first and second diffused material forming an active area of respective high and low resistivities, means for focusing an image of the radiation onto said active area, means for providing a voltage gradient to one type of said materials, said last-mentioned means being connected by respective ohmic contacts to spaced apart points of said one material, and means for sequentially sensing said system for providing an image of a radiation pattern sensed by said detection system.

References Cited

UNITED STATES PATENTS

| | | | |
|---|---|---|---|
| 3,083,262 | 3/1963 | Hanlet | 178—7.1 |
| 3,111,556 | 11/1963 | Knoll et al. | 178—7.1 |
| 3,210,548 | 10/1965 | Morrison | 250—211 |
| 3,343,002 | 9/1967 | Ragland | 307—88.5 |

ROBERT L. GRIFFIN, *Primary Examiner.*

R. L. RICHARDSON, *Assistant Examiner.*

U.S. Cl. X.R.

250—211; 313—108